(12) United States Patent
Sawada (10) Patent No.: US 7,164,375 B2
(45) Date of Patent: Jan. 16, 2007

(54) ANALOG TO DIGITAL CONVERTER USING BOTH ANALOG AND DIGITAL OFFSET VOLTAGES AS FEEDBACK

(75) Inventor: Akinobu Sawada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/157,556

(22) Filed: Jun. 21, 2005

(65) Prior Publication Data
US 2006/0012504 A1    Jan. 19, 2006

(30) Foreign Application Priority Data
Jul. 16, 2004    (JP) .............................. 2004-210195

(51) Int. Cl.
*H03M 3/00* (2006.01)
(52) U.S. Cl. ...................... 341/143; 341/118; 341/120
(58) Field of Classification Search ................ 341/118, 341/120, 131, 155, 143; 324/601; 327/307; 330/2
See application file for complete search history.

(56) References Cited

U.S. PATENT DOCUMENTS

| | | | |
|---|---|---|---|
| 4,590,458 A | * | 5/1986 | Evans et al. ................. 341/118 |
| 4,761,634 A | * | 8/1988 | Yamaguchi et al. ........ 341/131 |
| 4,996,529 A | * | 2/1991 | Connell ....................... 341/118 |
| 5,621,408 A | * | 4/1997 | Cake et al. .................. 341/143 |
| 5,896,101 A | * | 4/1999 | Melanson ..................... 341/143 |
| 6,002,352 A | * | 12/1999 | El-Ghoroury et al. ....... 341/139 |
| 6,191,715 B1 | * | 2/2001 | Fowers ......................... 341/120 |
| 6,262,625 B1 | * | 7/2001 | Perner et al. .................... 330/2 |
| 6,278,391 B1 | * | 8/2001 | Walker ......................... 341/118 |
| 6,313,769 B1 | * | 11/2001 | Mangahas et al. ........... 341/118 |
| 6,538,490 B1 | * | 3/2003 | Yoshizawa .................. 327/307 |
| 6,642,874 B1 | * | 11/2003 | Lin et al. ...................... 341/143 |
| 6,806,756 B1 | * | 10/2004 | Manlove et al. ............. 327/307 |
| 6,999,014 B1 | * | 2/2006 | Oliaei et al. ................. 341/143 |
| 7,002,497 B1 | * | 2/2006 | Brooks ......................... 341/131 |

FOREIGN PATENT DOCUMENTS

JP    2003-264462    9/2003

* cited by examiner

*Primary Examiner*—Linh V. Nguyen
(74) *Attorney, Agent, or Firm*—Hogan & Hartson LLP (57) ABSTRACT

An A/D conversion unit includes an A/D converter, an analog offset canceller connected to the input end of the A/D converter, and a digital offset canceller connected to the output end of the A/D converter. The analog offset canceller performs a coarse adjustment of offset canceling voltage in the first stage of offset cancellation operation to largely cancel out the offset voltage involved in the A/D conversion unit by shifting the range of the input signal. Then the digital offset canceller performs a fine adjustment of offset canceling voltage in the second stage of offset cancellation operation to completely cancel out a residual offset voltage. Through the offset cancellation operation, the linearity error of the A/D converter, linearity error of the D/A converter, and matching error between the A/D and D/A converters are completely cancelled out.

13 Claims, 6 Drawing Sheets

ANALOG TO DIGITAL CONVERTER USING BOTH ANALOG AND DIGITAL OFFSET VOLTAGES AS FEEDBACK

FIELD OF THE INVENTION

This invention relates to an analog-to-digital (A/D) conversion unit having an offset canceling function, and to a communication unit, such as a mobile telephone, utilizing such A/D conversion unit.

BACKGROUND OF THE INVENTION

There have been known an A/D conversion unit having an offset canceling function for eliminating or canceling out the offset error involved in the A/D converter of the unit (see, for example, Japanese Patent Application Laid Open No. 2003-264462).

Figure 6:
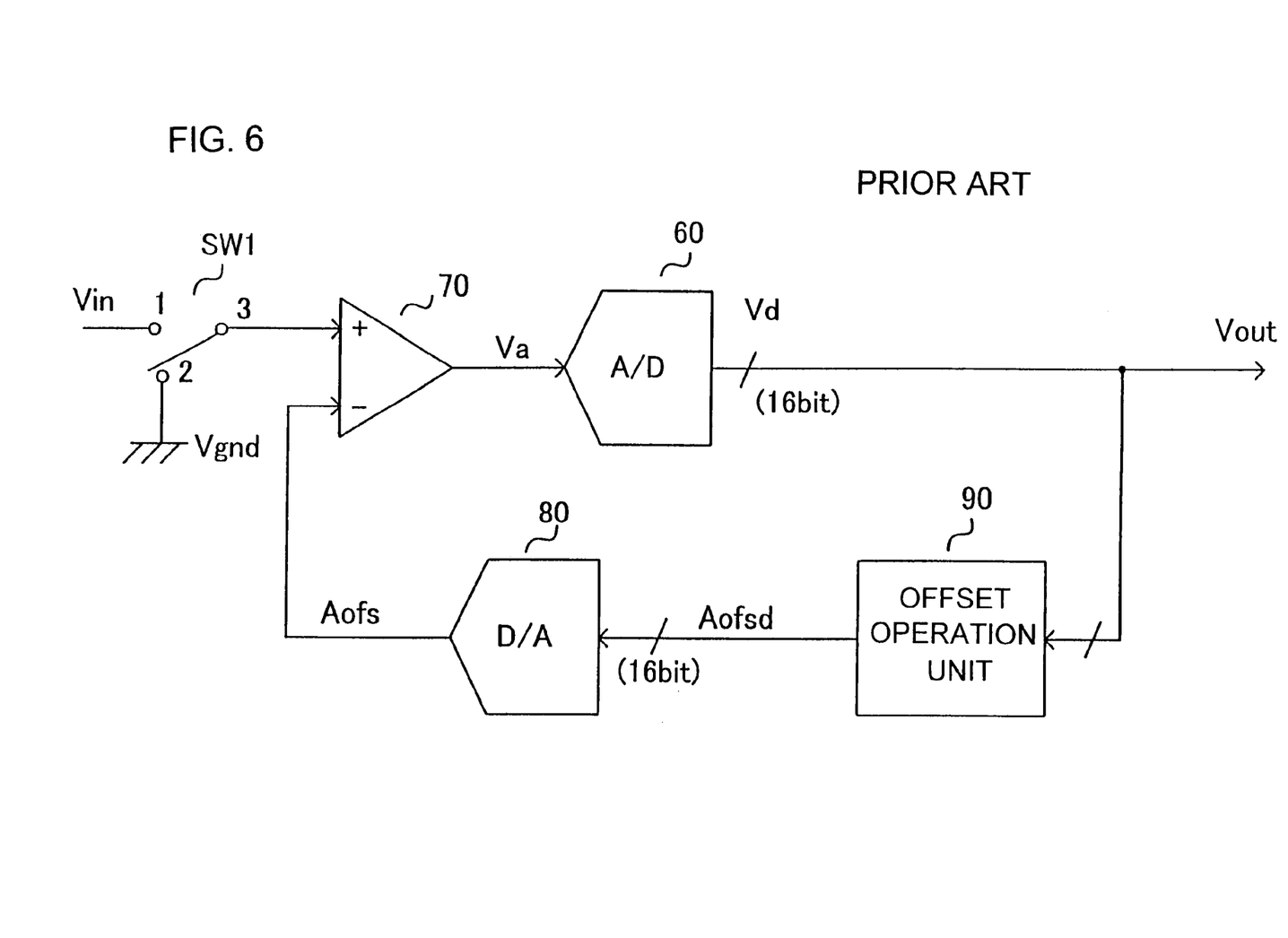
FIG. 6 is a block diagram of an A/D conversion unit having a conventional offset cancellation function.

FIG. 6 shows a circuit arrangement of an A/D conversion unit having a conventional offset canceling function as disclosed in FIG. 7 of the patent application cited above.

As shown in FIG. 6, the A/D conversion unit has an A/D converter 60 for converting an analog input voltage Vin into a digital output voltage Vout, wherein, and hereinafter as well, digital voltage means voltage of a digitized signal.

The A/D converter 60 has an offset error, which causes the A/D converter to output a non-zero voltage if the input thereto were zero voltage. In order to remove the offset error, the converter 60 is provided with an analog offset canceller 70, a digital-to-analog (D/A) converter 80, an offset operation unit 90, and an input changeover switch SW1.

In the example shown in FIG. 6, the changeover switch SW1 is thrown to a contact point 2 to obtain the voltage to be input to remove the offset error (the voltage referred to as the offset canceling voltage), which causes the ground potential Vgnd (or zero voltage) to be supplied to the positive (+) input terminal of the analog offset canceller 70 serving as a subtracter. The voltage of the negative (−) input terminal of the analog offset canceller 70 is also zero at this stage. The output voltage of the analog offset canceller 70 is supplied as the analog voltage Va to the A/D converter 60, which converts the input voltage into a digital voltage Vd prior to providing it as the output voltage Vout from the conversion unit.

The output voltage Vout would be zero if the A/D converter 60 and the analog offset canceller 70 had no offset error. In actuality, however, the A/D converter 60 and the analog offset canceller 70 have offset errors so that the output voltage Vout of the A/C conversion unit is offset by a certain offset voltage Vofs.

The offset operation unit 90 has an integration circuit adapted to process the offset voltage Vofs to obtain a digitized offset canceling voltage Aofsd for canceling out the offset voltage Vofs. This digitized offset canceling voltage Aofsd is converted into an analog offset canceling voltage Aofs by the D/A converter 80. The analog offset canceling voltage Aofs is input into the negative (−) input terminal of the analog offset canceller 70.

The changeover switch SW1 may be thrown to a contact point 1 with the analog offset canceling voltage Aofs applied to the negative (−) input terminal of the analog offset canceller 70, so that the analog input voltage Vin is input into the positive (+) input terminal of the analog offset canceller 70.

Under this condition, the offset errors of the A/D converter 60 and the analog offset canceller 70 will cancel out, causing the A/D conversion unit to provide an output voltage Vout in accord with the input voltage Vin.

However, the A/D converter 60 of the A/D conversion unit disclosed in the cited patent application has a linearity error Vofs-ad. In addition, the D/A converter 80 provided to remove the offset error presents a further linearity error Vofs-da and a matching error Vofs-m associated with matching between the D/A converter 80 and the A/D converter 60. Moreover, fluctuations Vofs-wn due to white noise also add to the errors.

It is noted that, although the offset voltage that remain in the A/D conversion unit (referred to as residual offset voltage) can be reduced by raising the accuracy of offset canceling capabilities of the A/D and D/A converters 60 and 80, respectively, the residual offset voltage of the converters will not be totally cancelled out. Further reduction of the residual offset voltage can be anticipated by increasing the number of sampled data for offset cancellation, which, however, will require an adversely long time to obtain the offset canceling voltage. Anyway, it is not possible with the prior art A/D conversion unit cited above to completely eliminate the offset voltage from the A/D conversion unit.

It should be noted that the prior art circuit for canceling the offset inevitably has a large size due to the fact that the D/A converter 80 requires the same bit number (16 bits for example) as the A/D converter 60.

When the analog input voltage Vin has a predetermined non-zero voltage level (hereinafter referred to as central voltage) Vctr superimposed on an input signal voltage Vsig, exhibiting a waveform similar to that of an RF modulation signal, it is also necessary to eliminate the offset voltage contained in the central voltage Vctr. However, in obtaining the offset canceling voltage, the analog input voltage Vin is set to zero in the conventional A/D conversion unit, so that the offset voltage or the central voltage Vctr cannot be eliminated. As a consequence, if the analog voltage Va saturates in the A/D conversion unit, the input voltage will be truncated (that is, its waveform will be clipped), thereby presenting an additional problem that the input signal voltage Vsig cannot be accurately converted into a correct digital signal.

SUMMARY OF THE INVENTION

It is therefore an object of the invention to provide an A/D conversion unit having an A/D converter and a D/A converter, the A/D conversion unit having an offset canceling function adapted to completely cancel out the linearity error Vofs-ad of the A/D converter, linearity error Vofs-da of the D/A converter, and matching error Vofs-m between the A/D and D/A converters.

It is another object of the invention to provide an A/D conversion unit for converting an input voltage Vin, the A/D conversion unit having an offset canceling function adapted to cancel out the offset voltage contained in the central voltage Vctr of the input voltage Vin, the inventive A/D conversion unit thereby capable of correctly converting the input signal voltage Vsig contained in the input voltage into a digital signal if the central voltage is superimposed on the signal voltage Vsig.

It is a further object of the invention to provide a communications apparatus, such as a mobile telephone, equipped with an A/D conversion unit having such offset canceling function.

According to one embodiment of the invention, there is provided an inventive A/D conversion unit 100 for converting an analog input voltage Vin into a digital output voltage Vout, the A/D conversion unit comprising:

an A/D converter 10 for outputting a digital voltage Vd;

an analog offset canceller 20 receiving the analog input voltage Vin and an analog offset canceling voltage Aofs obtained on the basis of the digital output voltage Vout, and outputting to the input end of the A/D converter 10 an analog voltage Va in accordance with the analog input voltage Vin minus the analog offset canceling voltage Aofs; and a digital offset canceller 30, connected to the output end of the A/D converter, for outputting the digital output voltage Vout that equals the digital voltage Vd minus a digital offset canceling voltage Dofs obtained on the basis of the digital output voltage Vout, wherein the analog offset canceller 20 is supplied with an analog offset canceling voltage obtained on the basis of the digital output voltage with the analog input voltage set to a predetermined level; and the digital offset canceller 30 is supplied with a digital offset canceling voltage Dofs obtained on the basis of the digital output voltage with the analog input voltage set to the predetermined level and with the analog offset canceling voltage supplied to the analog offset canceller 20.

According to another embodiment of the invention, there is provided an inventive A/D conversion unit for converting an analog input voltage Vin into a digital output voltage Vout, the A/D converter comprising:

an analog offset canceller 20 receiving an analog input voltage Vin and an analog offset canceling voltage Aofs and outputting an analog voltage Va in accordance with the analog input voltage Vin minus the analog offset canceling voltage Aofs;

an A/D converter 10 for converting the analog voltage Va received from the analog offset canceller 20 into a digital voltage Vd having a first predetermined number of bits;

a digital offset canceller 30 receiving the digital voltage Vd from the A/D converter 10 and a digital offset canceling voltage Dofs and outputting a digital output voltage Vout that equals the digital voltage Vd minus the digital offset canceling voltage Dofs;

an offset operation unit 50 receiving the digital output voltage Vout and outputting a digitized analog offset canceling voltage Aofsd having a second predetermined number of bits and the digital offset canceling voltage Dofs; and a D/A converter 40 for converting the digitized offset canceling voltage Aofsd into the analog offset canceling voltage Aofs.

The analog offset canceling voltage Aofs may be obtained by the offset operation unit and the D/A converter 40 based on the digital output voltage Vout with the analog input voltage Vin set to a predetermined level and with the analog offset canceling voltage and the digital offset canceling voltage set to zero voltage. The digital offset canceling voltage Dofs can be obtained by the offset operation unit 50 based on the digital output voltage Vout, with the analog input voltage Vin set to a predetermined level and with the digital offset canceling voltage held at zero voltage.

The analog offset canceling voltage Aofs may be obtained based on the average of a multiplicity (N) of sampled values of the digital output voltage Vout. The digital offset canceling voltage Dofs may be obtained based on the average of a multiplicity (M) of sampled values of the digital output voltage Vout.

The second predetermined number of bits of the digitized analog offset canceling voltage Aofsd may be less than the first predetermined number of bits of the digital voltage Vd.

The A/D converter 10 may have a reference voltage and provide a positive digital voltage in accordance with the excess in the analog voltage Va relative to the reference voltage Vref, but provide a negative digital voltage in accordance with the shortage in the analog voltage Va relative to the reference voltage Vref.

The predetermined level Vctr of the input voltage Vin may be set to become equal to the reference voltage.

The input voltage Vin may be a voltage resulting from superimposing an input signal voltage Vsig on a central voltage Vctr having the predetermined level.

The A/D conversion unit may have a nonvolatile storage device for storing the digitized analog offset canceling voltage Aofsd and the digital offset canceling voltage Dofs.

According to a further aspect of the invention, there is provided a communications apparatus, comprising:

a pre-stage circuit for outputting a voltage resulting from superposing an input signal voltage on a central voltage having the predetermined level; and any one of the A/D conversion units as described above and adapted to receive the output voltage of the pre-stage circuit.

The inventive A/D conversion unit has an analog offset canceller connected to the input end of the A/C converter and the digital offset canceller connected to the output end of the A/D converter. In the first stage of offset cancellation, coarse offset cancellation is performed by the analog offset canceller, shifting the range of the input voltage, in which a large portion of the offset voltage involved is cancelled out. In the second stage, fine offset cancellation is performed by the digital offset canceller in which the residual offset voltage is totally cancelled out.

Thus, the residual offset in the A/D conversion unit that cannot be removed by the analog offset canceller can be cancelled out or removed by the digital offset canceller, thereby allowing accurate A/D conversion.

Since the analog offset canceller is intended to eliminate a large portion of the offset voltage, including fluctuations of the input voltage which, presumably, has a predetermined level (i.e. central voltage), the analog offset canceller and the D/A converter can be of low accuracy, which allows reduction in size of the A/D conversion unit.

The number of data sampled for analog offset cancellation can be reduced by the invention, thereby reducing time for the offset cancellation.

The A/D converter 10 may have a reference voltage Vref, which permits the converter to output a positive or negative digital voltage in accordance with excess or shortage in the analog voltage Va with respect to the reference voltage Vref. By setting the central voltage Vctr of the analog input voltage Vin, or, to become equal to the reference voltage Vref, the very offset error involved in the central voltage can be automatically cancelled out. When the positive and negative digital voltages output from the A/D converter 10 are configured to be complementary to each other, the average of the input voltage (integrated value of the input voltage divided by the sampling number) can be obtained by simply summing these digital voltages Vd.

A pre-stage circuit outputting a voltage including a central voltage and superimposed on a signal voltage (e.g. RF modulation signal) may be coupled to an inventive A/D conversion unit. This arrangement enables cancellation of the offset voltage and reduction of distortion of the output voltage due to clipping of the signal voltage.

The use of a nonvolatile storage device as a memory 52 for storing the digitized analog offset canceling voltage Aofsd and digital offset canceling voltage Dofs enables readout of the stored offset canceling voltages Aofsd and Dofs from the nonvolatile storage device any time, once they are stored. Thus, the A/D conversion unit can provide accurate A/D conversion without repeating the procedure to obtain the voltages Aofsd and Dofs each time. Prior to shipping an inventive A/D conversion unit and/or communications apparatus to a user, the offset cancellation procedure can be performed to store the offset canceling voltages Aofsd and Dofs therefor in the nonvolatile storage device, thereby allowing the user to enjoy the use of a low-cost yet accurate A/D conversion unit and/or a communications apparatus equipped with an accurate A/D conversion unit.

DETAILED DESCRIPTION OF THE PREFERRED EMBODIMENT

An A/D conversion unit having an offset canceling function according to one embodiment of the invention will now be described in detail, along with a communications apparatus utilizing such A/D conversion unit with reference to the accompanying drawings. As a communication apparatus, it would be best suited for applying to mobile apparatus, for example.

Figure 1:
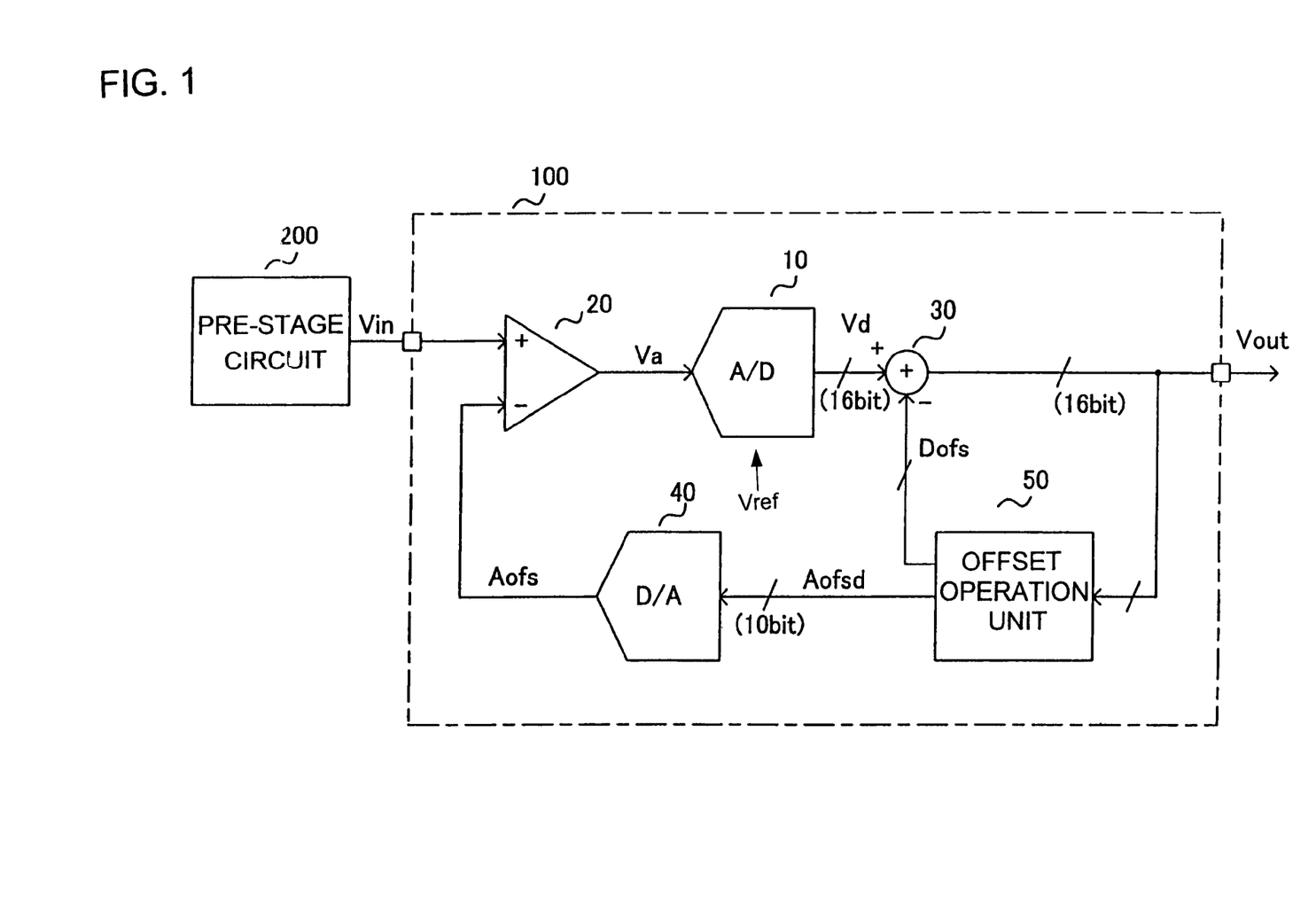
FIG. 1 is a block diagram of an A/D conversion unit having an offset cancellation function according to the invention.

FIG. 1 shows an A/D conversion unit 100 and a pre-stage circuit 200 providing an analog input voltage Vin to the A/D conversion unit 100.

The pre-stage circuit 200 outputs for example an RF modulation signal, and, together with the A/D conversion unit 100, constitutes a communications apparatus. Under normal operating conditions, the pre-stage circuit 200 outputs an input signal voltage Vsig superimposed with a predetermined central voltage Vctr. To obtain an offset canceling voltage for the A/D conversion unit 100, only the central voltage Vctr is output from the pre-stage circuit 200.

An analog offset canceller 20 of the A/D conversion unit 100 is supplied with the analog input voltage Vin from the pre-stage circuit 200 and an analog offset canceling voltage Aofs, and outputs an analog voltage Va in accord with the analog input voltage Vin minus the analog offset canceling voltage Aofs. To obtain the offset canceling voltage, only the central voltage Vctr is input as the analog input voltage Vin.

It is likely that the central voltage Vctr fed in this way is deviated from its initially intended voltage by an offset voltage, that is, the central voltage Vctr contains an offset voltage. Moreover, it is likely that the analog offset canceller 20 itself gives an offset voltage. For example, when the analog offset canceller 20 includes an amplifier, the analog offset canceller 20 gives an offset voltage generated by the amplifier.

Figure 5:
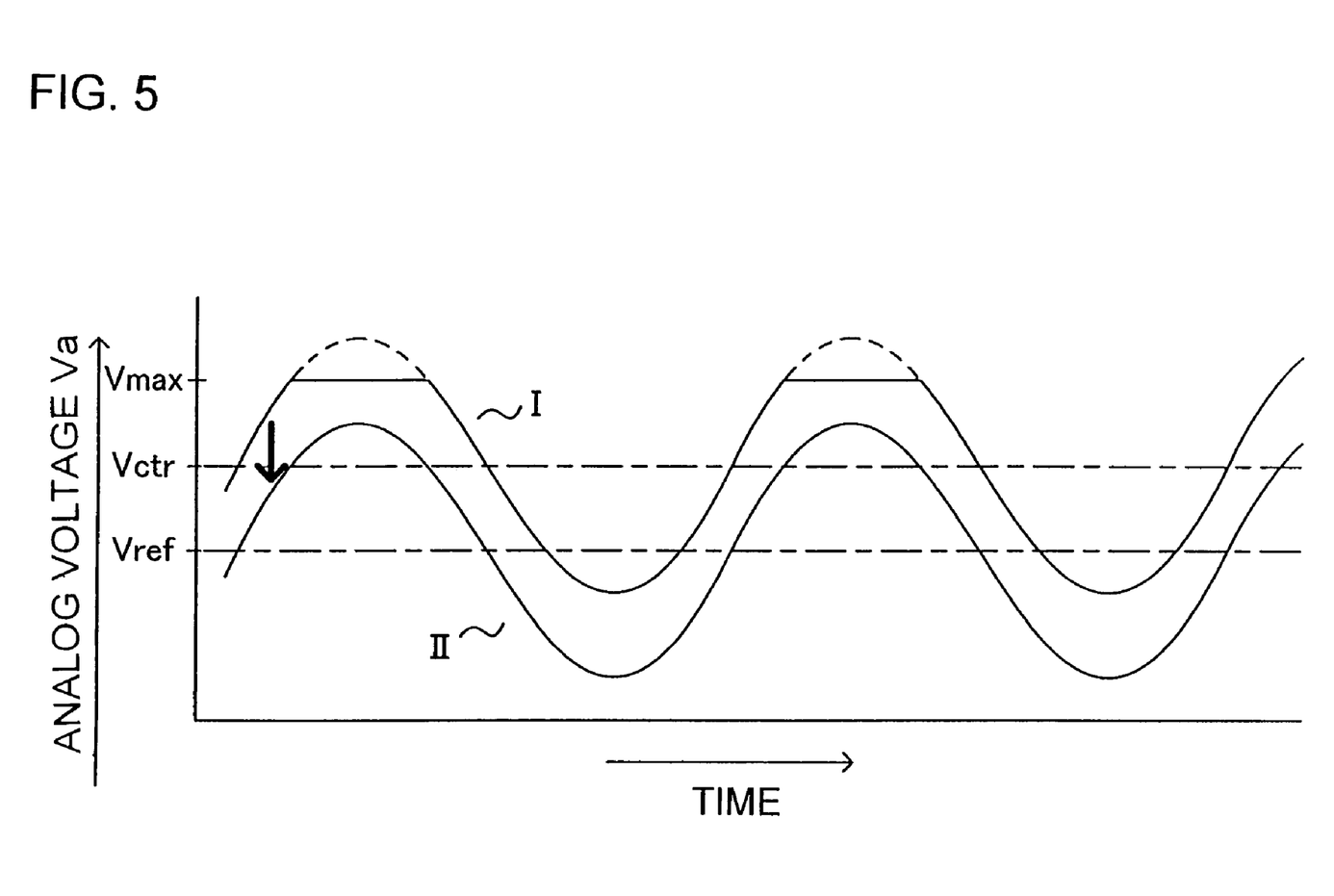
FIG. 5 is a graph comparing a conventional and an inventive offset cancellation function when an input voltage has an offset voltage.

An A/D converter 10 transforms the analog voltage Va received from the analog offset canceller 20 into a digital voltage Vd of a first predetermined number of bits, which are 16 bits in the example shown herein. The A/D converter 10 has a reference voltage Vref (FIG. 5). The A/D conversion unit preferably converts into a digital voltage the voltage obtained by subtracting the reference voltage Vref from the analog voltage Va. The (predetermined) level of the central voltage Vctr of the input voltage Vin received from the pre-stage circuit 200 is primarily set to become equal to this reference voltage Vref. However, there are cases where the central voltage Vctr contains an offset voltage.

The A/D converter 10 will output zero voltage if the input analog voltage Va is equal to the reference voltage Vref. When the input analog voltage Va exceeds the reference voltage Vref, the A/D converter 10 outputs a positive digital voltage Vd in accordance with the excess in the analog voltage Va relative to the reference voltage. When the input analog voltage Va is less than the reference voltage Vref, the A/D converter 10 outputs a negative digital voltage Vd in accordance with the shortage in the analog voltage Va relative to the reference voltage.

These positive and negative output voltages are preferably complementary to each other. In this case, the average of the input voltage Vin (i.e. integrated voltages divided by the number of sampled voltages) can be obtained by simply summing the positive and negative digital voltages Vd. Thus, calculation of the offset voltage is easy.

A digital offset canceller 30 is supplied with the digital voltage Vd from the A/D converter 10 and with the digital offset canceling voltage Dofs from an offset operation unit 50. The digital offset canceller 30 outputs a voltage Vout that equals the digital voltage Vd minus the digital offset canceling voltage Dofs.

Figure 2:
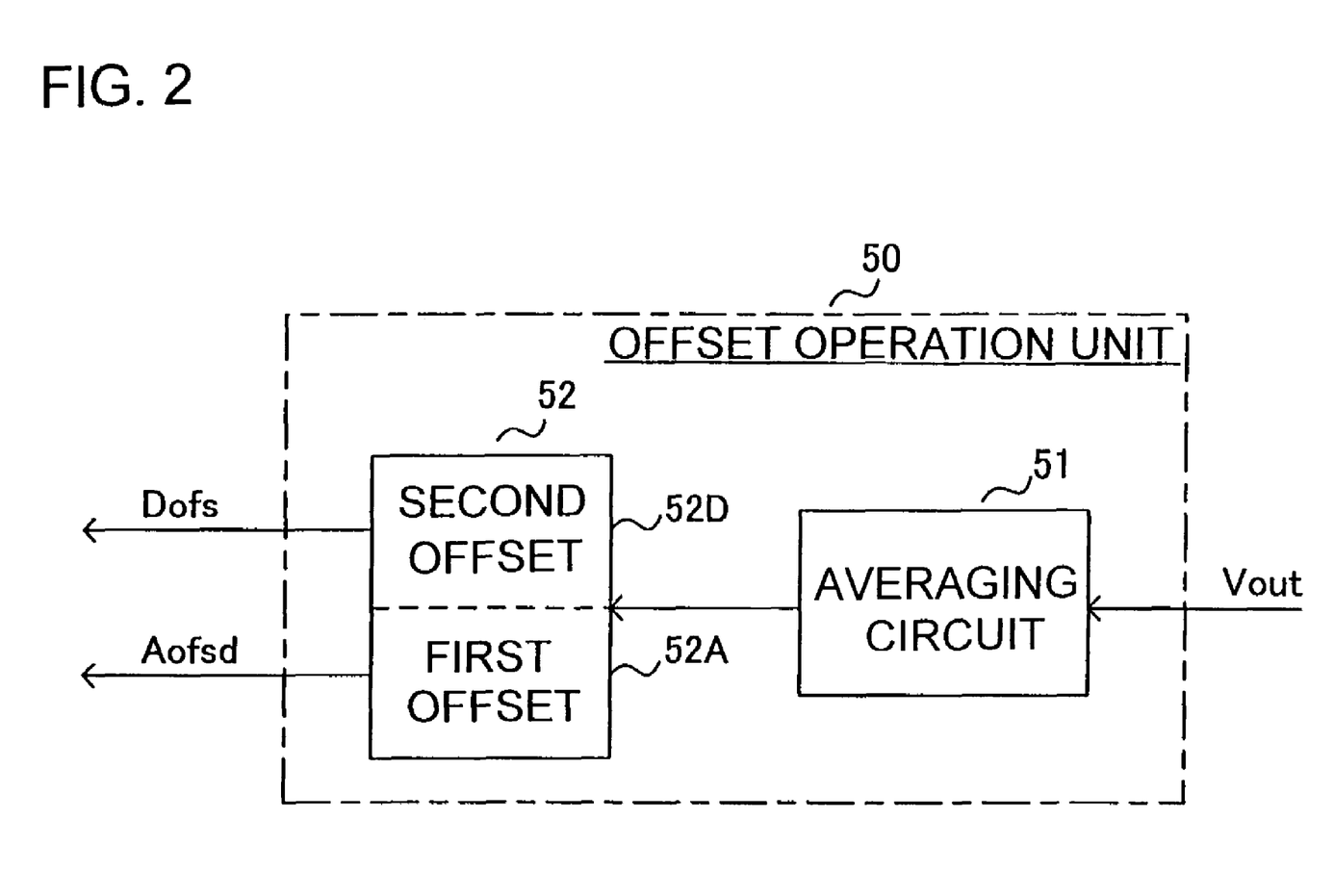
FIG. 2 is a block diagram of an offset operation unit for use with the A/D conversion unit of FIG. 1.

Upon receipt of the output voltage Vout, the offset operation unit 50 outputs a digitized analog offset canceling voltage Aofsd and the digital offset canceling voltage Dofs. To do this, the offset operation unit 50 is provided with an averaging circuit 51 and a storage device 52 as shown in FIG. 2. The storage device 52 has a first offset storage section 52A for storing the digitized analog offset canceling voltage Aofsd and a second offset storage section 52D for storing the digital offset canceling voltage Dofs.

The storage device 52 is preferably a nonvolatile storage device consisting of, for example, an EEPROM, a flash memory, and an FRAM.

The offset operation unit 50 obtains the analog offset canceling voltage Aofs from the average of N sampled output voltages Vout (N being an arbitrary integer), and the digital offset canceling voltage Dofs from the average of M sampled output voltages Vout (M being an arbitrary integer). The larger N and M, the more accurate offset cancellation will be obtained, leaving less residual offset voltage in the A/D conversion unit. The numbers N and M are each properly chosen to meet required operational conditions of the A/D conversion unit.

A D/A converter 40 transforms the digitized analog offset canceling voltage Aofsd having a second predetermined number of bits into an analog offset canceling voltage Aofs. This D/A converter 40 is designed to largely cancel out the offset voltage, including the variation in the predetermined input voltage supplied to the A/D conversion unit 100, using the analog offset canceller 20. For this reason, the analog offset canceller 20 and the D/A conversion circuit 40 can be of low accuracy. Thus, the second predetermined number of bits can be less (e.g. 10 bits) than the first predetermined number of bits (e.g. 16 bits). In this way, the analog circuit portion of the A/D conversion unit 100, affecting greatly on the size of the entire unit, can be reduced in size, and hence minimizing the A/D conversion unit 100.

Offset canceling operation of the inventive A/D conversion unit 100 will now be described. First, the analog input voltage Vin is set to a predetermined central voltage Vctr and at the same time both the analog offset canceling voltage Aofs and the digital offset canceling voltage Dofs are held at zero voltage. Under this condition, the analog offset canceling voltage Aofs is obtained by the offset operation unit 50 and D/A converter 40 based on the output voltage Vout. The analog offset canceling voltage Aofs is supplied to the analog offset canceller 20. This is the first step of the offset cancellation operation, providing coarse adjustment of the offset canceling voltage to remove a large portion of the offset voltage.

Next, while keeping the analog input voltage Vin at the predetermined level, the analog offset canceling voltage Aofs thus obtained is supplied to the analog offset canceller 20, and the digital offset canceling voltage Dofs is held at zero voltage. Under this condition, the digital offset canceling voltage Dofs (having a predetermined number of bits, which are 16 bits in this example) is determined by the offset operation unit 50 based on the output voltage Vout, and supplied to the digital offset canceller 30. This is the second step of the offset cancellation operation, providing fine adjustment of the offset canceling voltage to remove minor offset voltages.

Figure 3:
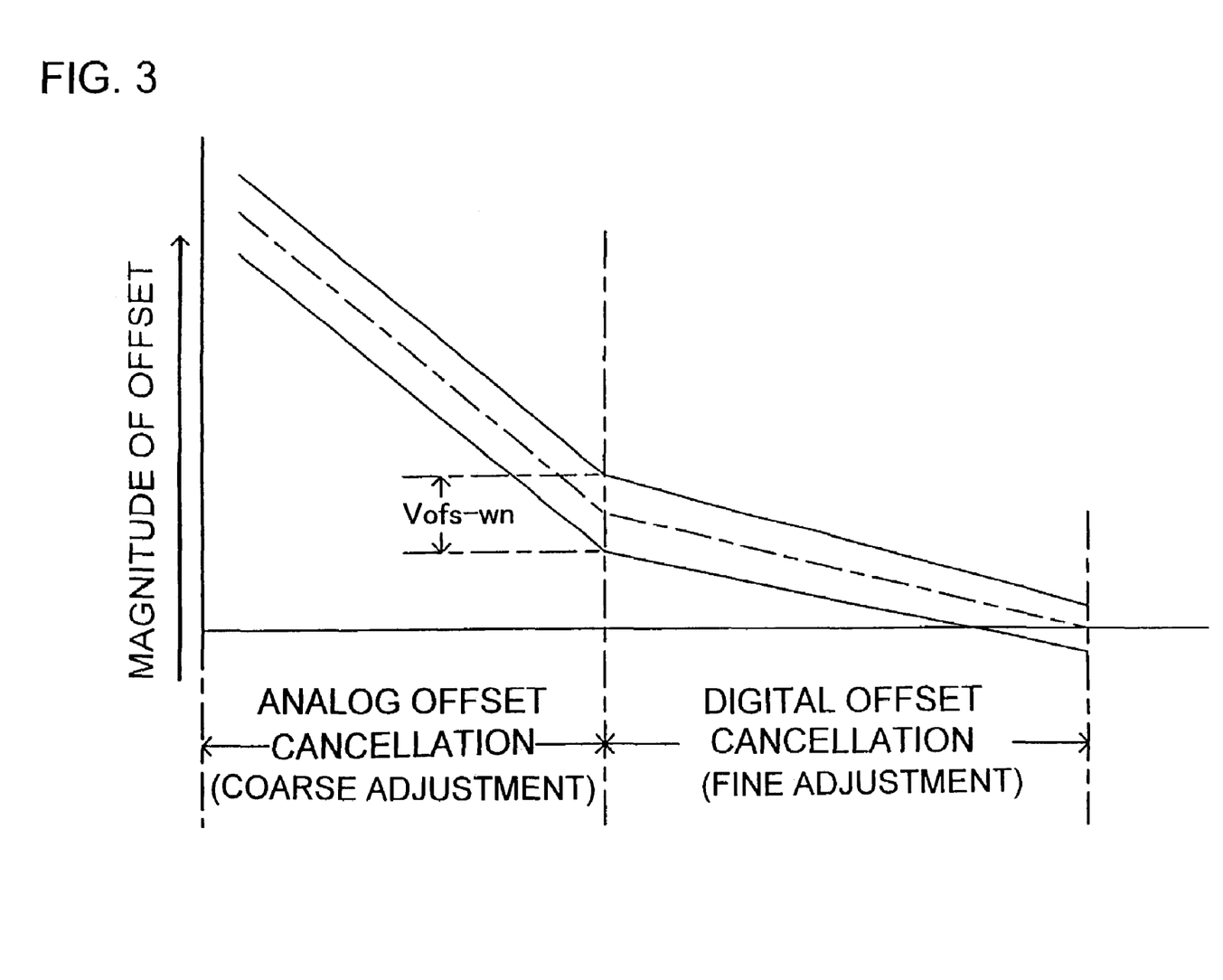
FIG. 3 is a graph illustrating a relationship between the magnitude of the residual offset and the degree of offset cancellation.

FIG. 3 illustrates a relationship between the magnitude of residual offset and the degree of offset cancellation. There exists in the A/D conversion unit 100 a linearity error Vofs-ad of the A/D converter 10, a linearity error Vofs-da of the D/A converter 40, a matching error Vofs-m between the A/D converter 10 and the D/A converter 40, and a white noise variation Vofs-wn. In addition, an offset voltage Vofs-ctr also exists in the central voltage Vctr received from the pre-stage circuit 200.

As described above, the coarse offset cancellation is performed in the first stage of the analog offset cancellation to remove a large portion of a large offset voltage, as shown in FIG. 3.

In the second stage of digital offset cancellation, a fine adjustment of the offset canceling voltage is performed to remove the residual offset voltage not removed in the first stage. In this fine adjustment, substantially all the offset voltages, except for the white noise variation Vofs-wn, are cancelled out, as shown in FIG. 3. That is, the linearity error Vofs-ad of the A/D converter 10, linearity error Vofs-da of the D/A converter 40, matching error Vofs-m between the A/D converter 10 and D/A converter 40, and offset voltage Vofs-ctr in the central voltage Vctr are removed. Thus, only the white noise variation Vofs-wn remains as a residual offset. It is anticipated that the white noise variation Vofs-wn can be reduced by increasing the number of samples in the fine adjustment, according to Vofs-wn/$M^{1/2}$.

Referring to the flow chart of FIG. 4, the offset cancellation operation will be described more in detail.

Figure 4:
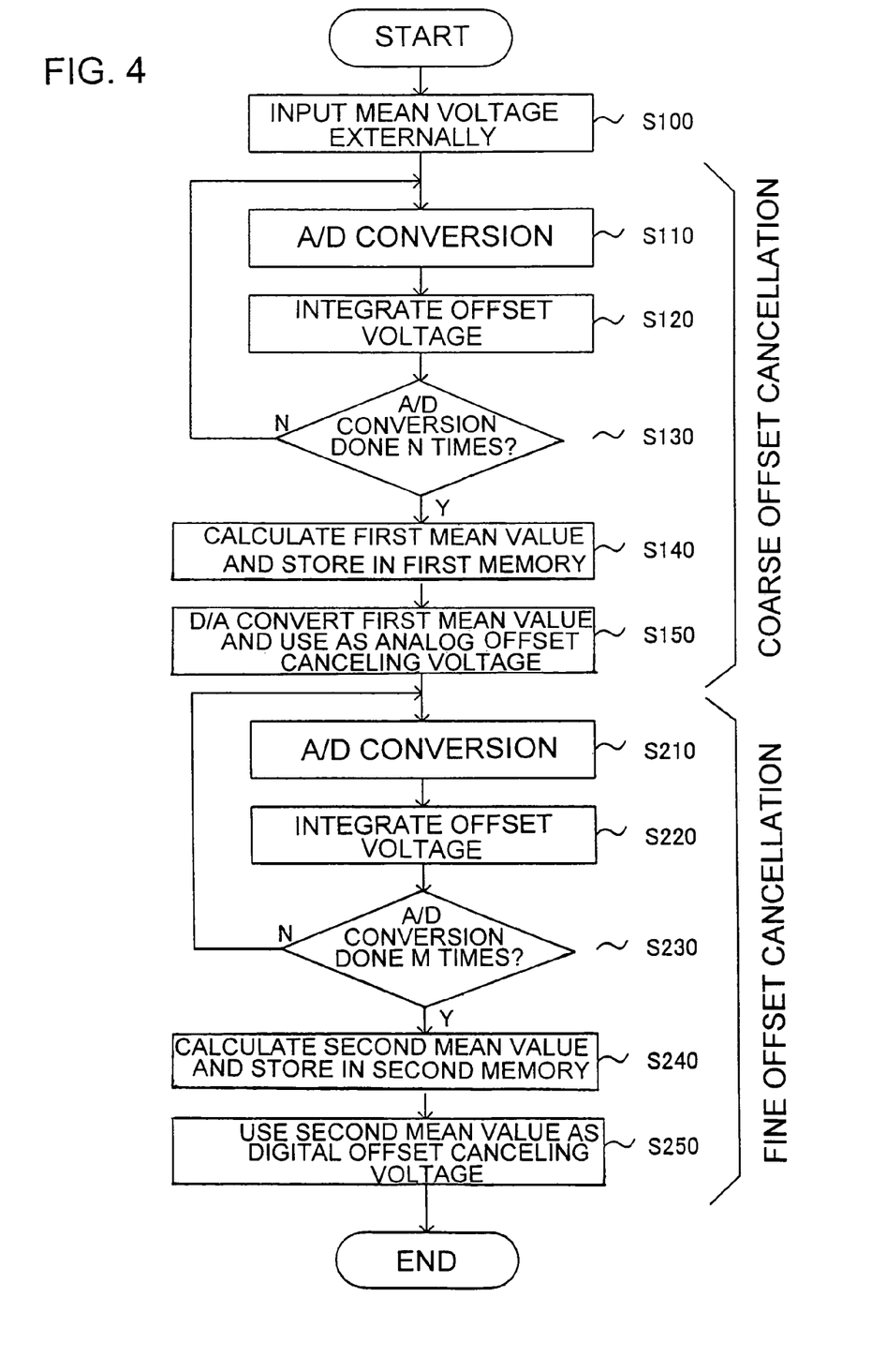
FIG. 4 is a flowchart illustrating a procedure of the inventive offset cancellation.

In step S100 of the offset cancellation procedure shown in FIG. 4, the predetermined central voltage Vctr of the pre-stage circuit 200 is fed to a positive (+) input terminal of the analog offset canceller 20. The central voltage Vctr is held at a constant level until the offset cancellation operation is completed.

First, coarse analog offset cancellation is performed. In step S110, A/D conversion is performed by the A/D converter 10. Since at this stage the analog offset canceling voltage Aofs and the digital offset canceling voltage Dofs are set to zero volt, the output voltage Vout, input into the offset operation unit 50, possibly contains all the offset voltages. The then output voltage Vout, representing the total offset voltage, is integrated or summed by an averaging circuit 51 (step S120). In step S130, it is determined as to whether the A/D conversion is performed N times or not for the coarse offset cancellation. If not, steps S110–130 are repeated.

As the A/D conversion is performed N times for the coarse offset voltage cancellation, the procedure proceeds to step S140, where the integrated output voltages are averaged by the averaging circuit 51 to obtain the digitized analog offset canceling voltage Aofsd from the average. The digitized analog offset canceling voltage Aofsd is stored in the first offset storage section 52A of the storage device 52. The integrated output voltages are cleared at this stage.

The digitized analog offset canceling voltage Aofsd is converted by the D/A converter 40 into an analog offset canceling voltage Aofs, which is input into the negative (−) input terminal of the analog offset canceller 20 (step S150). This completes the analog coarse offset cancellation.

Next, fine offset cancellation is performed for the digital offset cancellation. In step S210, A/D conversion is performed by the A/D converter 10. At this stage, the analog offset canceling voltage Aofs is supplied to the analog offset canceller 20, with the digital offset canceling voltage Dofs being held at zero voltage. Thus, the output voltage Vout containing residual offset voltages that survived the coarse offset cancellation is input into the offset operation unit 50. The output voltage Vout, now representing the offset voltage, is integrated in the averaging circuit 51 (step S220). In step S230, a determination is made as to whether the A/D conversion is repeated M times for the fine adjustment, and if not, steps S210–S230 are repeated.

As the A/D conversion is performed M times for the fine adjustment, the operation proceeds to step S240, where the average of the integrated output voltages is calculated by the averaging circuit 51 to obtain the digital offset canceling voltage Dofs. The digital offset canceling voltage Dofs is stored in the second offset storage section 52D of the storage device 52.

The digital offset canceling voltage Dofs is supplied as a negative (−) input to the digital offset canceller 30 (step S250). The digital offset canceller 30 subtracts the digital offset canceling voltage Dofs from the digital voltage Va received from the A/D converter 10 to provide the output voltage Vout free of the offset voltage. This implies that the analog coarse offset cancellation and the digital fine offset cancellation have been performed in the A/D conversion unit, through steps S100–S250. The offset cancellation operation of the A/D conversion unit 100 is then ended.

The offset canceling voltages Aofsd and Dofs are stored in the storage device 52 serving as a nonvolatile storage device, for use in later offset cancellation operation. Thus, the A/D conversion unit 100 can be started up without redetermining the offset canceling voltages Aofsd and Dofs for accurate A/D conversion each time. It is preferred to perform the offset cancellation operation and store the offset canceling voltages Aofsd and Dofs in the nonvolatile storage device prior to shipping a conversion unit and/or a communications apparatus to a user, thereby providing the user with an easy-to-use and highly accurate A/D conversion unit and/or a communications apparatus. Incidentally, it is preferable to update the offset canceling voltages Aofsd and Dofs and restore them in the nonvolatile storage device when the use conditions have changed and/or a certain period has elapsed.

FIG. 5 is a graph depicting the influence of the offset voltage on the A/D conversion when the central voltage Vctr of the analog input voltage Vin, superposed on the input signal voltage Vsig, contains an offset voltage, the input voltage thereby exhibiting a waveform similar to that of a RF modulation signal.

The central voltage Vctr is preferably equal to the predetermined reference voltage Vref. If the central voltage Vctr has an offset voltage |Vctr-Vref| with respect to the reference voltage Vref, the offset voltage |Vctr-Vref| cannot be canceled out by a conventional A/D conversion unit. In this case, the analog input voltage Vin can saturate in the offset canceller 70, causing the analog voltage Va to be truncated or clipped at a maximum level Vmax as indicated by curve I of FIG. 5, which results in a failure of A/D conversion of the input signal voltage Vsig into a correct digital signal.

In contrast, the A/D conversion unit 100 of the invention cancels out the offset voltage |Vctr-Vref| by the analog offset canceller 20. As a consequence, given any input voltage Vin, the analog input voltage Va will not be clipped as indicated by curve II of FIG. 5, allowing the input signal voltage Vsig to be converted into a correct digital signal.

A communications apparatus such as a mobile telephone can be configured to include the inventive A/D conversion unit 100 in combination with a pre-stage circuit 200 outputting an input signal voltage Vsig superposed with a predetermined central voltage Vctr, like an RF modulation signal for example. The present invention can reduce the size of an A/D conversion unit, make the unit operable at reduced power, remove the offset voltage of the unit, and reduce the distortion of the output voltage of the unit due to clipping of signal voltage.

It is noted that during offset cancellation operation the A/D conversion unit 100 can be supplied with an input voltage containing a central voltage Vctr superimposed on an alternating voltage such as sinusoidal wave. In this case also, proper offset cancellation can be attained through the averaging operation by the offset operation unit 50.

I claim:

1. An A/D conversion unit for converting an analog input voltage into a digital output voltage, said A/D conversion unit comprising:
    an A/D converter for outputting a digital voltage;
    an analog offset canceller receiving said analog input voltage and an analog offset canceling voltage obtained on the basis of said digital output voltage, and outputting to the input end of said A/D converter an analog voltage in accord with said analog input voltage minus said analog offset canceling voltage; and
    a digital offset canceller connected to the output end of said A/D converter, for outputting said digital output voltage that equals said digital voltage minus a digital offset canceling voltage obtained on the basis of said digital output voltage; wherein
    said analog offset canceller is supplied with an analog offset canceling voltage obtained on the basis of said digital output voltage with said analog input voltage set to a predetermined level;
    said digital offset canceller is supplied with a digital offset canceling voltage obtained on the basis of said digital output voltage with said analog input voltage set to said predetermined level and with said analog offset canceling voltage supplied to said analog canceller; and
    said A/D converter has a reference voltage and provides a positive digital voltage in accordance with the excess in said analog voltage relative to said reference voltage, but provides a negative digital voltage in accordance with the shortage in said analog voltage relative to said reference voltage.

2. The A/D conversion unit according to claim 1, wherein said predetermined level of said analog input voltage is set to become equal to said reference voltage.

3. The A/D conversion unit according to claim 2, wherein said analog input voltage is a voltage resulting from superimposing an input signal voltage on a central voltage having said predetermined level.

4. An A/D conversion unit for converting an analog input voltage into a digital output voltage, said A/D conversion unit comprising:
    an A/D converter for outputting a digital voltage;
    an analog offset canceller receiving said analog voltage and an analog offset canceling voltage obtained on the basis of said digital output voltage, and outputting to the input end of said A/D converter an analog voltage in accord with said analog input voltage minus said analog offset canceling voltage;
    a digital offset canceller connected to the output end of said A/D converter, for outputting said digital output voltage that eauals said digital voltage minus a digital offset canceling voltage obtained on the basis of said digital output voltage; and
    a nonvolatile storage device for storing said digitized analog offset canceling voltage and digital offset canceling voltage, wherein
    said analog offset canceller is supplied with an analog offset canceling voltage obtained on the basis of said digital output voltage with said analog voltage set to a predetermined level; and
    said digital offset canceller is supplied with a digital offset canceling voltage obtained on the basis of said digital output voltage with said analog input voltage set to said predetermined level and with said analog offset canceling voltage supplied to said analog offset canceller.

5. An A/D conversion unit, comprising:
    an analog offset canceller receiving an analog input voltage and an analog offset canceling voltage and outputting an analog voltage in accord with said analog input voltage minus said analog offset canceling voltage;
    an A/D converter for converting said analog voltage received from said analog offset canceller into a digital voltage having a first predetermined number of bits;
    a digital offset canceller receiving said digital voltage from said A/D converter and a digital offset canceling voltage and outputting a digital output voltage that equals said digital voltage minus said digital offset canceling voltage;
    an offset operation unit receiving said digital output voltage and outputting a digitized analog offset canceling voltage having a second predetermined number of bits and said digital offset canceling voltage; and
    a D/A converter for converting said digitized analog offset canceling voltage into said analog offset canceling voltage; wherein
    said analog offset canceling voltage is obtained by said offset operation unit and D/A converter based on said digital output voltage with said analog input voltage set to a predetermined level and with said analog offset canceling voltage and said digital offset canceling voltage set to zero voltage; and
    said digital offset canceling voltage is obtained by said offset operation unit based on said digital output voltage, with said analog input voltage set to said predetermined level and with said digital offset canceling voltage held at zero voltage.

6. The A/D conversion unit according to claim 5, wherein
said analog offset canceling voltage is obtained based on the average of a multiplicity (N) of sampled values of said digital output voltage; and
said digital offset canceling voltage is obtained based on the average of a multiplicity (M) of sampled values of said digital output voltage.

7. The A/D conversion unit according to claim 5, wherein said second predetermined number of bits of said digitized analog offset canceling voltage is less than said first predetermined number of bits of said digital voltage.

8. The A/D conversion unit according to claim 5, wherein said A/D converter has a reference voltage and provides a positive digital voltage in accordance with the excess in said analog voltage relative to said reference voltage, but provides a negative digital voltage in accordance with the shortage in said analog voltage relative to said reference voltage.

9. The A/D conversion unit according to claim 8, wherein said predetermined level of said analog input voltage is set to become equal to said reference voltage.

10. The A/D conversion unit according to claim 9, wherein said analog input voltage is a voltage resulting from superimposing an input signal voltage on a central voltage having said predetermined level.

11. The A/D conversion unit according to claim 5, further comprising a nonvolatile storage device for storing said digitized analog offset canceling voltage and digital offset canceling voltage.

12. An A/D conversion unit, comprising:
an analog offset canceller receiving an analog input voltage and an analog offset canceling voltage and outputting an analog voltage in accord with said analog input voltage minus said analog offset canceling voltage;
an A/D converter for converting said analog voltage received from said analog offset canceller into a digital voltage having a first predetermined number of bits;
a digital offset canceller receiving said digital voltage from said A/D converter and a digital offset canceling voltage and outputting a digital output voltage that equals said digital voltage minus said digital offset canceling voltage;
an offset operation unit receiving said digital output voltage and outputting a digitized analog offset canceling voltage having a second predetermined number of bits and said digital offset canceling voltage;
a D/A converter for converting said digitized analog offset canceling voltage into said analog offset canceling voltage; and
a nonvolatile storage device for storing said digitized analog offset canceling voltage and a digital offset canceling voltage.

13. A communications apparatus, comprising:
a pre-stage circuit for outputting a voltage resulting from superimposing an input signal voltage on a central voltage having a predetermined level; and
an A/D conversion unit according to any one of claims 1 through 4 and 5 through 12, said A/D conversion unit receiving said voltage output from said pre-stage circuit.

* * * * *